United States Patent [19]
Frasnetti et al.

[11] Patent Number: 6,097,000
[45] Date of Patent: Aug. 1, 2000

[54] CONTROL PANEL VENTILATION SYSTEM FOR ELECTRICAL FOOD COOKING APPLIANCES COMPRISING A COOKING HOB AND AN OVEN

[75] Inventors: Luca Frasnetti, Cunardo; Adriano Scaburri, Somma Lombardo; Davide Cabri, Morazzone, all of Italy

[73] Assignee: Whirlpool Corporation, Benton Harbor, Mich.

[21] Appl. No.: 09/109,965

[22] Filed: Jul. 2, 1998

[30] Foreign Application Priority Data

Jul. 4, 1997 [IT] Italy ................................. MI97A1598

[51] Int. Cl.[7] ................................................. F27D 11/00
[52] U.S. Cl. ........................ 219/395; 219/396; 219/397; 219/398; 219/399; 219/400
[58] Field of Search ..................................... 219/395, 396, 219/397, 398, 400, 412, 460.1, 461.1, 480.1; 126/21 R, 21 A, 273 R

[56] References Cited

U.S. PATENT DOCUMENTS

| | | | |
|---|---|---|---|
| 3,832,988 | 9/1974 | Doner | 126/21 R |
| 3,877,457 | 4/1975 | Doner | 345/126 |
| 4,180,049 | 12/1979 | Carr et al. | 126/21 A |
| 4,191,875 | 3/1980 | Cunningham | 219/623 |
| 4,237,368 | 12/1980 | Welch | 219/449 |
| 4,511,781 | 4/1985 | Tucker et al. | 219/10.77 |
| 4,517,448 | 5/1985 | Crain et al. | 219/388 |
| 4,539,469 | 9/1985 | Gigandet | 219/412 |
| 4,549,052 | 10/1985 | Simon | 219/10.49 |
| 4,886,046 | 12/1989 | Welch | 126/299 D |
| 5,611,327 | 3/1997 | Filho et al. | 126/39 R |
| 5,676,870 | 10/1997 | Wassman et al. | 219/400 |
| 5,801,362 | 9/1998 | Pearlman et al. | 219/400 |
| 5,864,120 | 1/1999 | Vroom et al. | 219/400 |

FOREIGN PATENT DOCUMENTS

| | | | |
|---|---|---|---|
| 2748796 | 11/1997 | France | F24C 15/00 |
| 04110520 | 4/1992 | Japan . | |

*Primary Examiner*—Teresa Walberg
*Assistant Examiner*—Vinod D Patel
*Attorney, Agent, or Firm*—Joel M. Van Winkle; Robert O. Rice; Stephen D. Krefman

[57] ABSTRACT

A ventilation system for electrical food-cooking appliances comprising a cooking hob and an oven with a fan positioned in a compartment between the two in order to generate air flow for cooling electronic components controlling the oven operation, in which the fan is of variable speed, its speed being gauged on the basis of the appliance use.

8 Claims, 3 Drawing Sheets

CONTROL PANEL VENTILATION SYSTEM FOR ELECTRICAL FOOD COOKING APPLIANCES COMPRISING A COOKING HOB AND AN OVEN

BACKGROUND OF THE INVENTION

Field of the Invention

This invention relates to a ventilation system for electrical food-cooking appliances comprising a cooking hob and an oven. The system involves the use of a fan positioned within that space or compartment of the said composite appliance lying between the hob and the oven. The purpose of the fan is to provide air flow through said compartment for increasing the reliability of the electronic components positioned thereat for controlling the hob and oven.

SUMMARY OF THE INVENTION

The main object of the invention is to provide a ventilation system which enables the level of ventilation to be adapted to the use of the appliance.

A further object of the invention is to provide a ventilation system which enables the annoyance (noise) to the user deriving from unrequired excess ventilation to be reduced.

A further object of the present invention is to provide a ventilation system which taking account of the appliance operating conditions gauges to an optimum extent the amount of required additional or extra ventilation on termination of the use of the appliance.

These and further objects which will be more apparent from the detailed description given hereinafter are attained by a system in accordance with the teachings contained in the accompanying claims.

BRIEF DESCRIPTION OF THE DRAWINGS

The invention will be further understood on reading the detailed description of one embodiment thereof given hereinafter by way of non-limiting example and illustrated on the accompanying drawings, in which.

DESCRIPTION OF THE PREFERRED EMBODIMENT

Figure 1:
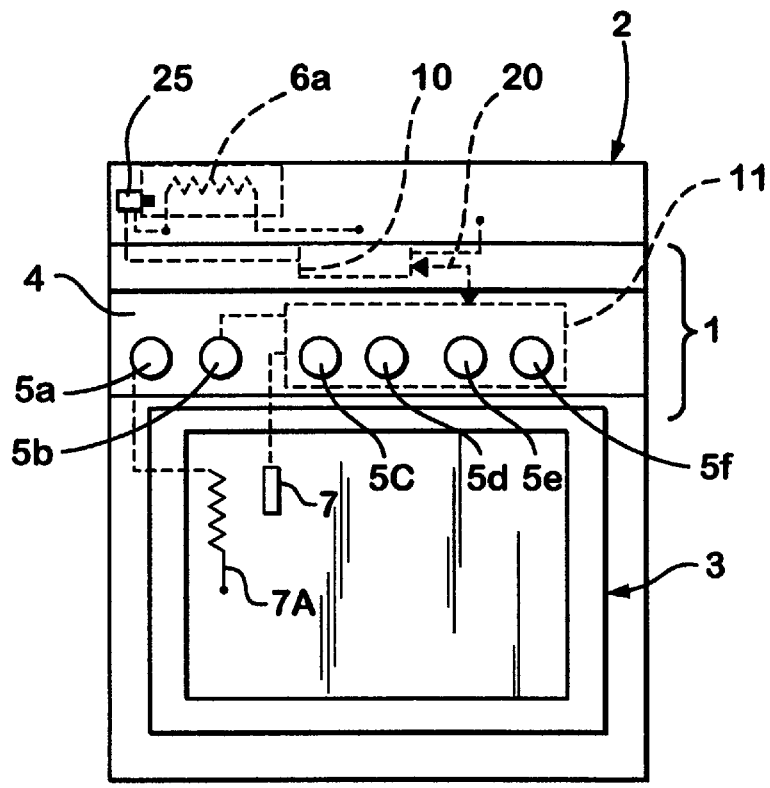
FIG. 1 is a schematic front view of the composite appliance with some internal parts or components shown by dashed and dotted lines.

The appliance shown comprises an outer casing 1 with an electrical cooking hob 2, in particular (in the example) of glass ceramic, an underlying electric oven 3, and a control panel 4 with a series of setting knobs 5a, b, c, d, e and f, the knobs 5a, b being relative to oven setting, and 5c, d, e and f to the cooking hob operation. In this example it is assumed that the cooking hob 2 comprises four conventional heating elements 6a, b, c and d, each being activated by the said knobs (5c, d, e and d), with each of which there is connected in series a safety switch (klixon) which opens the power circuit on reaching a temperature dangerous for the conventional hob plate 2A with which the cooking hob 2 is provided.

In this example the knob 5a is used for switching the oven on and off jointly with temperature selection made by the thermostat knob 5b, i.e. for powering or not powering a resistance element 7A located in the oven, and possibly a fan, not shown, if the oven is of the an-assisted type. The knob 5b is used to set the required oven temperature. The effective temperature is measured by a sensor 7 positioned within the oven.

Within the casing 1 between the oven and cooking hob there is a compartment or interspace 9 in which a variable-speed tangential fan 8 is positioned together with the electronic control and power components for the appliance.

These electronic components are an electronic power module 10 and an electronic user interface 11.

Figure 2:
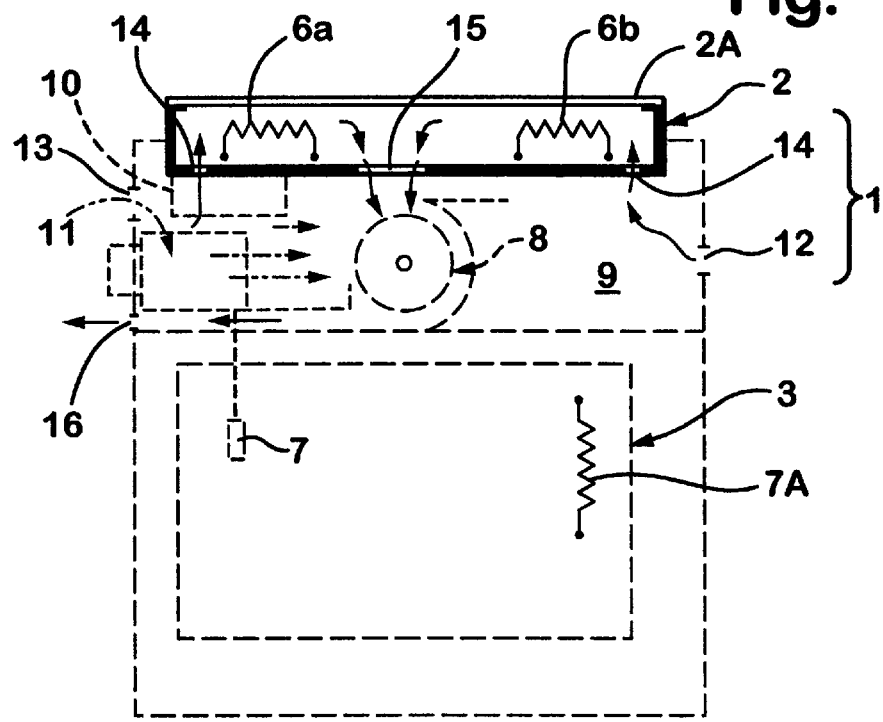
FIG. 2 is an even more schematic partly sectional side view of the composite appliance.

When in operation, the fan 8 creates within the interspace 9 an air flow along the paths indicated by the arrows of FIG. 2, to limit the casing within the compartment 9. The air stream enters the compartment from rear apertures 12 and front apertures 13, strikes the electronic components 10, 11, passes partly through the cooking hob 2 (by entering through suitable holes 14 provided in the lower face of the hob and leaving through central holes facing the suction side of the fan) and discharges to the outside through a delivery duct 16.

The power module 10 and the user interface 1 1 are connected together via a serial communication 20 allowing information relative to the system to be mutually exchanged. The power module 10 is controlled by a program based for example on fuzzy or conventional logic, able to estimate the temperature of the conventional glass plate 2A of the cooking hob 2 on the basis of the energy delivered by an individual heating element (6a, b, c, d). This temperature information is used within the power module 10 to adapt the control cycles of the resistance element or elements 6a, b, c and d such as to limit the temperature of the glass plate 2A to a set safety and reliability value. By way of the serial communication 20 this information is transferred to the user interface 11 to enable it to know the temperature conditions of the plate 2A, both when heating and when cooling. By way of this serial communication 20 the user interface 11 transmits to the power module the information relative to the position of the knobs 5c, d, e and f (regarding which of the heating elements 6a, b etc. are switched on and the thermal power which these are required to deliver).

The user interface 1 1 is operationally connected to the knob 5b for analysis of the on/off cycles, in particular for analysis of the on and off periods (duty cycle) executed by the thermostat connected to the sensor 7. This connection enables the user interface 11 to estimate with sufficient approximation (during both heating and cooling) the temperature conditions of the environment surrounding the oven, i.e. of the compartment 9 in which the power module 10 and the user interface 11 are positioned and in which the temperature is limited by the fan 8.

The temperature information received from the cooking hob 2 (or rather from the power module 10) and that estimated for the oven 3 enable the user interface 11 to control the variable-speed fan 8 by adapting it to the real cooling requirements of the compartment 9.

Figure 3:
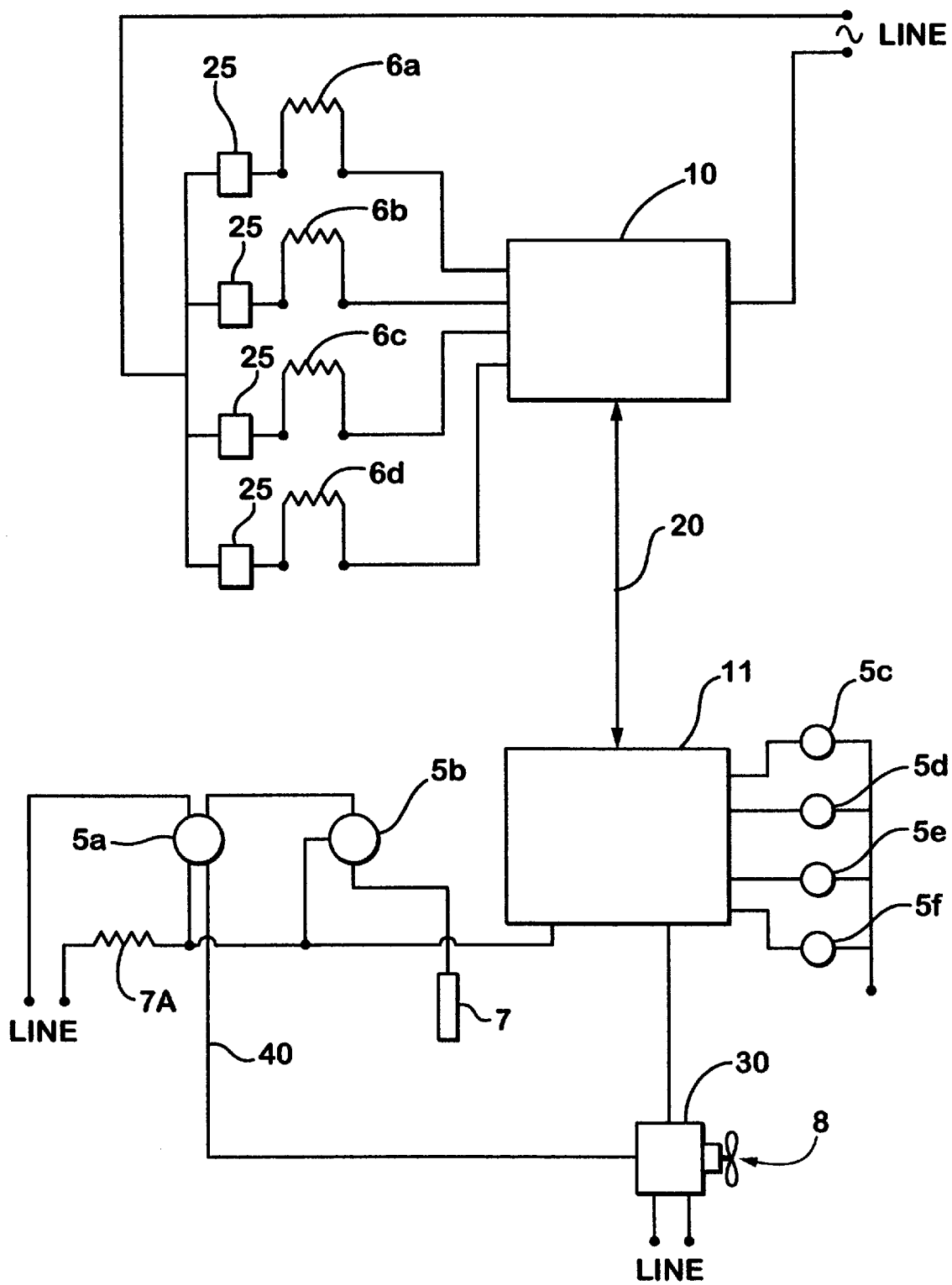
FIG. 3 is a schematic illustration of the electrical/electronic circuit of the composite appliance.

Each time the heating element or elements 6a, b, c and d of the cooking hob 2 are switched on by rotating the relative knob or knobs 5c, d, e and f; the user interface 11 acts (FIG. 3) on an electronic control section 30 for the fan 8 to regulate its rotational speed on the basis of the thermal power delivered by the heating elements 6a, b, c and d of the cooking hob 2. In particular, if the total delivered power exceeds a certain value, the fan is regulated to maximum speed. If instead it is below this value, the user interface sets it to a reduced speed. On termination of cooking, when the knob is returned to zero, the power module 10 informs the user interface 11 of the state of cooling of the glass plate 2A, and on the basis of this information the interface decides for how much further time the fan is to operate at a reduced r.p.m. (extra ventilation). This extra ventilation subsequent to the switching-off of the cooking hob eliminates inertial temperature rises which could otherwise occur if the fan were switched off simultaneously with the cooking hob.

With regard to the oven, each time it is switched on (rotation of the selection knob 5a to any position other than zero), the fan 8 is forced to operate at maximum r.p.m. under the control, by bypassing through the line 40 (FIG. 3), of the electronic control section 30 for the fan 8 which is activated manually by the user interface 11 as stated. When the oven operating temperature is selected (by the knob 5b) the user interface commences its analysis of the on-off cycles of the resistance element 7A. The ambient temperature of the region 9 is deduced from this analysis. On switching off the oven, the bypass 40 is deactivated and the control of the fan 8 returns to the user interface 11 which controls the duration and intensity of the extra ventilation (for the same reasons as those described for the cooking hob 2) on the basis of the overall operating conditions "read", in practice, at the oven resistance element 7A during operation.

To obtain the reduced speed or speeds of the fan 8 determined by the user interface 11, the electronic section 30 is used, and which can comprise a triac (or similar electronic switch) connected in series with the motor of the fan 8. The motor can be powered by the mains and be of the single phase induction type. The triac gate receives a square-wave signal (synchronized with zero-zero crossing) with a frequency for example of 5 Hz and a duty cycle variable from 20 to 100% set by the user interface 11. By means of this control, the motor is powered at full mains voltage only during the "on" cycle of the square control wave, whereas during the "off" cycle the motor is disconnected from the mains (and hence not powered). This method of operation can be seen as a continuous very rapid switching on and off of the motor, this on and off switching in combination with the inertia of the motor and of the mechanical part of the fan enabling the fan to run at an r.p.m. less than the rated r.p.m.

Again, to ensure that the motor starts under any voltage and temperature conditions, the control signal fed to the triac gate is preceded, at the moment of switch-on, by a continuous activation signal of 5 seconds (indicative value). This prolonged activation at full power enables the motor to start under any operating condition within regulatory limits.

Figure 4:
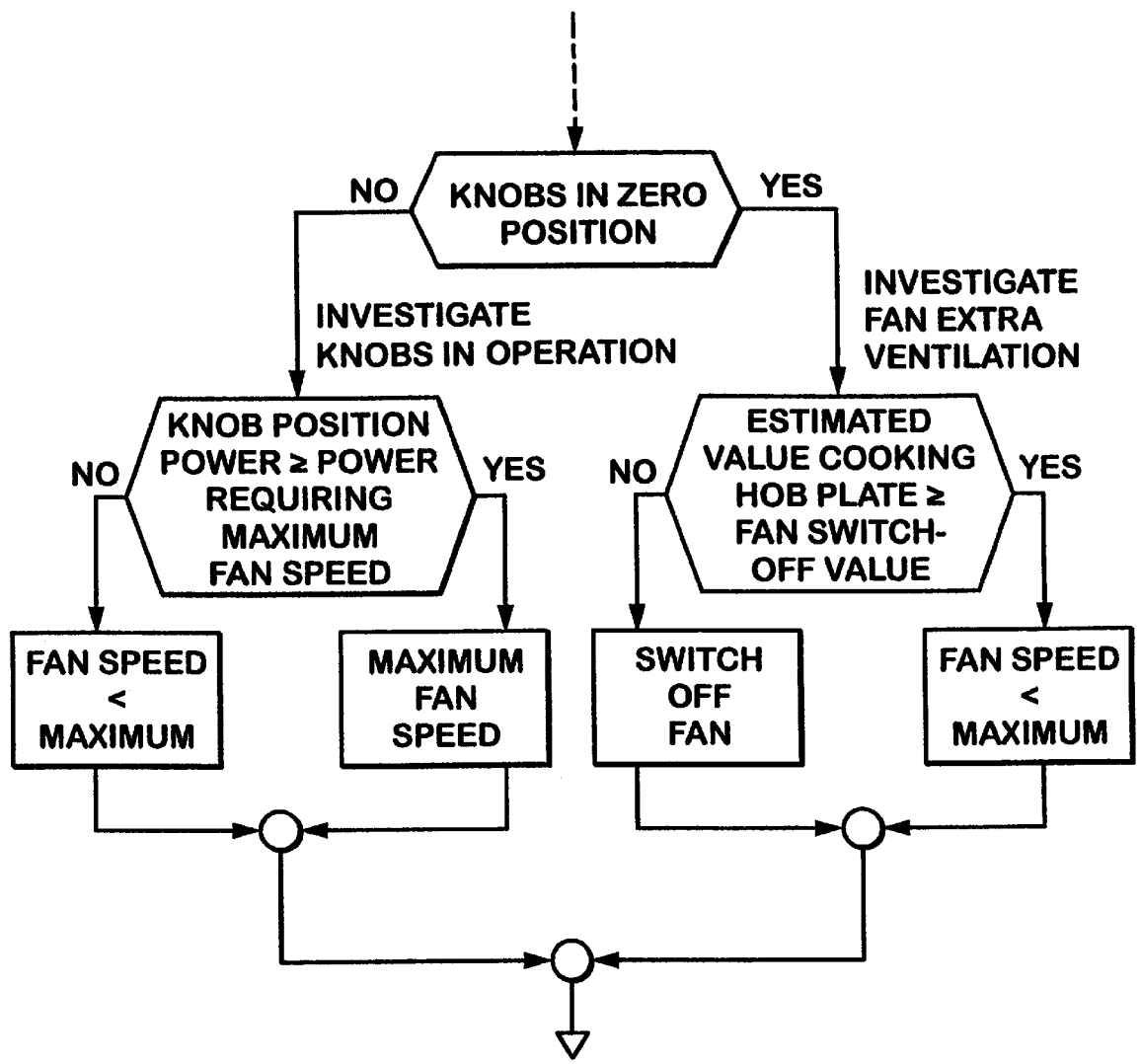
FIG. 4 is a simplified partial flow diagram relative to the appliance operation.

The schematic partial flow diagram shown by way of example in FIG. 4 further illustrates the invention. When a knob (5c, d, e and f) relative to the cooking hob 2 is set to position 0 (i.e. the off position of the relative heating element 6a, b, c and d), a check is made to determine whether the estimated (by the power module 10) temperature of the cooking hob glass plate 2A is greater than or equal to a predetermined safety temperature for the cooking hob glass plate 2A If it is greater the fan is made to further rotate but at reduced speed.

If it is less, the fan is switched off (that part of the flow diagram involved up to this point is the right side of FIG. 4).

In contrast, if the knobs relative to the cooking hob 2 are in an active position (left side of FIG. 4), and this position involves a delivered power greater than a value P the fan is rotated at maximum speed, whereas if it does not then the speed is lower.

The above described method of operation enables the ventilation required to maintain reliability of the components in the hob to be gauged on the basis of the use of the cooking hob, or likewise for the oven. This gauging of the ventilation is noted by the user as a general reduction in the noise and air flow produced by the appliance, and also concerns the duration and intensity of the extra ventilation.

The gauging of the extra ventilation based on temperature estimates obtained by processing the delivered energy enables the desired function to be achieved without the addition of sensors (hence with zero additional cost).

An embodiment of the invention has been described in which the cooking hob is of glass ceramic type or the like and has its support surface for the food containers or its hob plate 2A of that material. The invention is however also applicable to appliances in which the cooking hob comprises exposed heating elements rising from a glass ceramic or similar surface. This application is also to be considered as falling within the scope of the present document.

We claim:

1. A ventilation system for electrical food-cooking appliances comprising:
   a cooking hob having at least one heating element;
   an oven positioned below the cooking hob;
   a compartment between the cooking hob and oven;
   electronic components positioned within the compartment and controlling the oven operation including the at least one heating element;
   an input device operatively connected to the electronic components for inputting a desired heating power for the at least one heat element; and
   a fan positioned in the compartment in order to generate air flow for cooling the electronic components, wherein the fan is of variable speed, its speed being calculated on the basis of the desired heating power for the at least one heating element such that direct temperature sensing within the compartment is not required.

2. A system as claimed in claim 1, wherein
   the hob has a resting surface formed of glass ceramic; and
   the electronic components comprise
      a power module for controlling the cooking hob and able to estimate the temperature of the cooking hob based on the energy delivered by the cooking hob, and
      an electronic module dialoging with the power module and arranged to know the operating condition of the oven and to estimate the temperature conditions of the compartment in which the two modules are positioned,
   wherein during sole operation of the cooking hob, the speed of the fan is controlled in response to the estimated temperature of the compartment.

3. A system as claimed in claim 2, wherein the electronic module controls the fan by gauging the real cooling requirements on the basis of the temperature conditions of the compartment and of the cooking hob.

4. A system as claimed in claim 1, wherein switching-on the oven causes the fan to operate at maximum rotational speed, and setting the operating temperature of the oven results in commencement of analysis of the oven on and off cycles such as to enable the temperature of the compartment to be deduced to allow the electronic module to set the duration of extra ventilation when the oven is switched off.

5. A system as claimed in claim 1, further comprising:
   a static switch connected in series with the fan, the static switch is driven by a square wave at frequency less than the mains frequency which powers it and having a variable duty cycle set by the electronic module.

6. A cooking appliance comprising:

an upper cooking surface having a plurality of heating elements;

an oven cavity having a heating element;

a control compartment positioned adjacent the upper cooking surface and having electronic components positioned therein for controlling the cooking appliance operation;

means for inputting a desired power level for the plurality of heating elements on the upper cooking surface;

a fan positioned to generate air flow for cooling the electronic components; and means for controlling the speed of the fan during operation of the plurality of heating elements on the upper cooking surface when the oven cavity heating element is not energized in response to the desired power level for the plurality of heating elements on the upper cooking surface.

7. The cooking appliance according to claim 6 further comprising:

a thermostat associated with the oven cavity;

a switch for energizing the heating element in the oven cavity, the oven cavity being heated to a temperature controlled by the thermostat;

means for energizing the fan at 100% speed when the oven cavity is selected for heating by the switch.

8. The cooking appliance according to claim 7, further comprising:

means for monitoring the on-off cycles of the oven cavity heating element and for calculating the temperature of the control compartment during oven cavity heating; and means for controlling the speed of the fan in response to the calculated control compartment temperature after the oven cavity heating is switched off.

* * * * *